United States Patent
Taura et al.

(10) Patent No.: US 6,707,733 B2
(45) Date of Patent: Mar. 16, 2004

(54) SEMICONDUCTOR MEMORY DEVICE

(75) Inventors: Tadayuki Taura, Zushi (JP); Shigeru Atsumi, Yokohama (JP); Shuji Maeda, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/318,020

(22) Filed: Dec. 13, 2002

(65) Prior Publication Data

US 2003/0117867 A1 Jun. 26, 2003

(30) Foreign Application Priority Data

Dec. 14, 2001 (JP) ........................................ 2001-381412

(51) Int. Cl.[7] ................................................ G11C 7/00
(52) U.S. Cl. ................... 365/200; 365/201; 365/230.03
(58) Field of Search ................................. 365/200, 201, 365/230.03

(56) References Cited

U.S. PATENT DOCUMENTS 6,320,800 B1 * 11/2001 Saito et al. .................. 365/200
6,434,064 B2 * 8/2002 Nagai ...................... 365/230.03
6,552,939 B1 * 4/2003 Miki et al. ................... 365/201

* cited by examiner

Primary Examiner—Huan Hoang
(74) Attorney, Agent, or Firm—Oblon, Spivak, McClelland, Maier & Neustadt, P.C.

(57) ABSTRACT

A semiconductor memory device comprises memory cell blocks, a first redundancy cell array for each of the memory blocks, a redundancy cell block, a second redundancy cell array for the redundancy block, a first defect rescuing circuit configured to output a replacement signal for replacing a defective cell array in the redundancy block with the first redundancy array, and a second defect rescuing circuit configured to output a replacement signal for replacing a defective memory block with the redundancy block, wherein the first defect rescuing circuit has a gate circuit which outputs the output replacement signal of the first address sensing circuit as valid at an address at which the second defect rescuing circuit is not implemented, and which outputs a signal indicating which block is a defective block outputted by the second defect rescuing circuit as valid at an address at which the second defect rescuing circuit is implemented.

9 Claims, 5 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2001-381412, filed Dec. 14, 2001, the entire contents of which are incorporated herein by reference.

BACKGROUND OF THE INVENTION

1. Field of the Invention

The present invention relates to a semiconductor memory device, and in particular, to a defect rescuing circuit for setting plural types of defect rescue units whose sizes are different.

2. Description of the Related Art

As a memory cell of an EEPROM which electrically erases/rewrites data, for example, a nonvolatile memory cell MC having an NMOS transistor structure as shown in FIG. 6 is used. A double well structure is formed in a p-type semiconductor substrate (Psub). An n-type Well region (Nwell) is formed in the double well structure and a p-type Well region (Pwell) is formed in the n-type well region (Nwell). An n-type diffusion layer forming a source (S) of the NMOS transistor and an n-type diffusion layer forming a drain (D) of the NMOS transistor are formed in the p-type well region (Pwell). A floating gate (FG) of the NMOS transistor and a control gate (CG) of the NMOS transistor are formed on the p-type well region (Pwell). The floating gate (FG) is formed of a polycrystalline silicon layer which is a first level layer and a control gate (CG) is formed of a polycrystalline silicon layer which is a second level layer. The floating gate (FG) and the control gate (CG) are separated by an insulating film formed therebetween.

In an actual EEPROM, a memory cell array comprises a plurality of memory cells MC arranged in a matrix formed in one well region. FIG. 7 shows an equivalent circuit of a memory cell array having a NOR gate type structure. In the memory cell array, one of the memory cells MC is selected by a plurality of row lines (word lines) WL and a plurality of column lines (bit lines) BL. The plurality of row lines (word lines) WL are connected to the control gates CG of the respective memory cells MC and the plurality of column lines (bit lines) BL are connected to the drains D of the respective memory cells MC. The sources S and Nwell and Pwell of all the memory cells MC are commonly connected to a common source line SL.

Operation of the memory cell MC is as follows. Erasing of data is carried out by applying, for example, 10V to the sources (S), Nwell, and Pwell of all the memory cells MC in the cell array formed in one p-type well region, and by applying, for example, −7V to all the word lines WL. The bit lines BL are maintained in a floating state. In this manner, electrons in the floating gates (FG) of the memory cells MC are emitted in the channels by tunneling, so that the threshold voltages of the memory cells become low. This state is, for example, data "1" (erased state).

Writing of data is carried out by applying, for example, 9V to the selected word line WL, and by applying, for example, 5V to the selected bit line BL. The source line SL is set to 0V. At this time, in the selected memory cell MC, electrons are injected in the floating gate (FG) due to hot electron injection, so that the threshold voltage of the selected memory cell becomes high. This state is data "0" (written state).

Reading of data carried out by applying a read voltage of, for example, about 5V to the selected word line WL. The bit line BLK is set to a low voltage of, for example, about 0.7V. The source line is set to 0V. At this time, when the selected memory cell is "0" (written state), an electric current does not flow because the memory cell is not turned on. When the selected memory cell is "1" (erased state), the memory cell is turned on, and an electric current of about 40 $\mu$A flows through the selected memory cell. Reading is carried out by amplifying the amplitude of the electric current by a sense amplifier circuit.

In such an EEPROM, defective cells may exist in the memory cell array due to problems (dust or the like) in manufacturing. Even if there are some defective cells, in order to make the memory cell array to a good product, various defect rescuing circuits (redundancy circuits) for rescuing defective cells are provided in the EEPROM. For example, a rescue in units of columns (column redundancy) is carried out with respect to a short-circuiting between the bit lines or a memory cell defect. A block rescue (block redundancy) is carried out in data erasing units with respect to a short-circuiting between the word lines and the source lines (source/P-Well or the like), because the short-circuiting between the word lines and the source lines is a detect in all the memory cells in the block in which the p-type well is commonly used, which is a data erasing unit.

FIG. 8 shows a relationship between the column rescue and the block rescue described above. As shown in FIG. 8, a redundancy column cell array for column rescue is provided in each of the plurality of normal cell blocks (cores). It is possible to carry out a column replacement corresponding to a defective bit line denoted by an x mark by using the redundancy column cell array. Also, a redundancy cell block (core) is provided with respect to defects of the normal cell blocks. It is possible to carry out a block replacement for a block defect denoted by an x mark, such as a word line short-circuiting with a source line, by using the redundancy cell block.

Specifically, in order to carry out defect rescue, testing of a memory chip is carried out, and a defect address is programmed in a defect address memory circuit in the chip on the basis of the test results. When the defect address memory circuit is configured by using a fuse, for example, a laser fusing type fuse, because the test process and the fuse circuit programming process by laser blow are completely separate, then the fuse circuit programming must be carried out after all the tests are completed.

However, in a case of an EEPROM, a test sequence is possible in which the defect address is sequentially programmed each time a defect is found in the test process, by using, as a memory element, a memory cell which is the same as the memory cell used for the EEPROM cell array in a defect address memory circuit. This is the reason that writing of the defect address can be carried out by using the test circuit as it is. A test time can be shortened by using such a test sequence. The reason is as follows. Even when a defective area is found in the EEPROM, if an attempt is made to continue the test as is up to the time when all the test results are obtained, a situation arises in which, for example, the writing operation never finishes in the defective area, so that it takes a large number of time for the test. When a sequential defect replacement control, in which the defect address is programmed immediately after a defect is found, is carried out, such a situation can be prevented, so that the test time can be shortened.

However, in the EEPROM, when a method is employed in which two types of defect rescue circuits such as a column redundancy circuit and a block redundancy circuit are loaded and a defect address is sequentially programmed in the test process, there is a problem such as follows. There is the possibility that a situation will arise in which a bit line defect is found in a given block, and a word line of the block which has been already column-relieved becomes defective in the test process after the column rescue is carried out. In this way, it is assumed that, when the rescue regions of the column rescue and the block rescue overlap, assuming that the defective column replacement in a defective block which is to be relieved is valid in the redundancy block, in the case where a defective column is further found in the redundancy block, there is the possibility that there will be no margin to carry out a defective column rescue.

For example, it is assumed that two sets of column rescue set are provided in each of the blocks. Assuming that column defects of the two sets exist in a main body block (normal cell block) before block rescue, and a column rescue is carried out, and thereafter, a block defect is found in the main body block to carry out block rescue. In such a case, when one set of column defects newly arises in the redundancy block, rescue is impossible since there is no longer a further rescue column set and the memory becomes a defective product.

BRIEF SUMMARY OF THE INVENTION

According to an aspect of the present invention, there is provided a semiconductor memory device comprising a plurality of memory cell blocks each comprising a plurality of memory cells; a first redundancy cell array provided for each of the memory cell blocks, the first redundancy cell array configured to rescue a defective cell array in the each memory cell block; a redundancy cell block provided for the plurality of memory cell blocks, the redundancy block being configured to rescue a defective block of the memory cell blocks; a second redundancy cell array provided for the redundancy cell block, the second redundancy cell array configured to rescue a defective cell array in the redundancy cell block; a first defect rescuing circuit having a first address memory circuit and a first address sensing circuit, the first address memory circuit configured to store an address of the defective cell array in the memory cell blocks, the first address sensing circuit configured to compare a signal of the stored address and an address signal from external and output a replacement signal for replacing the defective cell array in the redundancy block with the first redundancy cell array; and a second defect rescuing circuit having a second address memory circuit and a second address sensing circuit, the second address memory circuit configured to store an address of the defective block of the plurality of memory cell blocks, the second address sensing circuit configured to compare a signal of the stored address of the defective block with an address signal from external to output a replacement signal for replacing the defective block of the plurality of memory cell blocks with the redundancy cell block, wherein the first defect rescuing circuit has a gate circuit which outputs the replacement signal outputted by the first address sensing circuit as valid at an address at which the second defect rescuing circuit is not implemented, and which outputs a signal indicating which block is a defective block outputted by the second defect rescuing circuit as valid at an address at which the second defect rescuing circuit is implemented.

DETAILED DESCRIPTION OF THE INVENTION

Hereinafter, an embodiment of the present invention will be described with reference to the figures.

Figure 1:
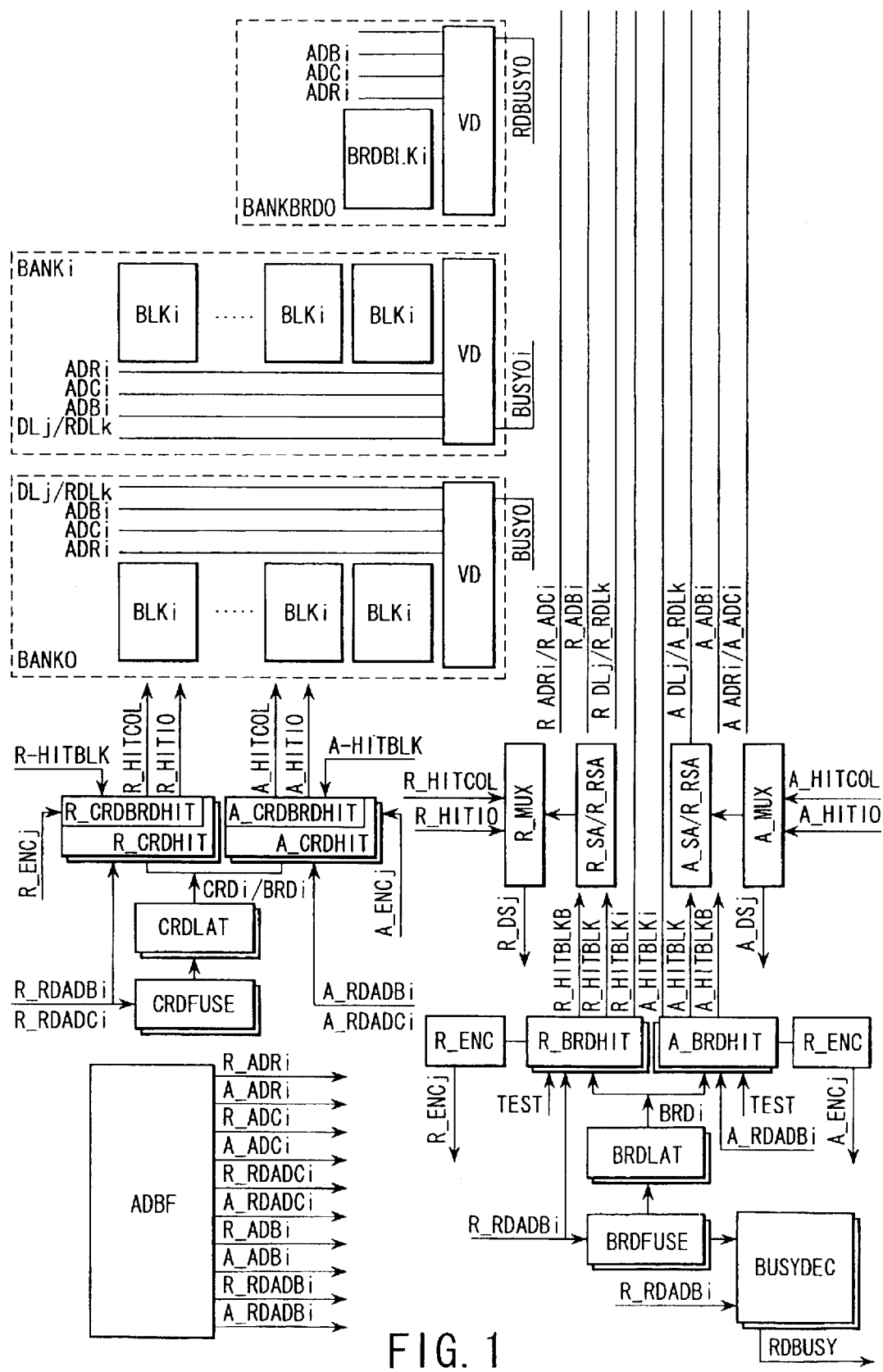
FIG. 1 is a diagram showing a configuration of an EEPROM in accordance with an embodiment of the present invention.

FIG. 1 is a circuit diagram showing a configuration of an EEPROM according to an embodiment of the present invention. Here, an example is shown in which a so-called dual-work is realized in which a memory cell array has, for example, two banks BANK0, BANKi, and reading of one bank BANKi is possible during execution of writing/erasing of the other bank BANK0. In order to realize such a dual-work, the EEPROM is configured such that an address signal, a sense amplifier circuit, a defect address sensing circuit and so on are provided for Read and for Auto, respectively, and they are distinguished by adding "R" to the respective names of the circuits and signals for Read, and adding "A" to the respective names of the circuits and signals for Auto.

Each of the normal (main body) banks BANK0, BANKi is formed of a plurality of blocks (cores) BLKi. Each of the blocks BLKi is a unit of data erasure. In order to relieve defects of the blocks BLKi in these banks BANK0, BANKi, a rescue bank (spare bank, redundancy bank) BANKBRD0 having at least one, preferably a plurality of, rescue block (spare block, redundancy block) BRDBLKi is provided.

Figure 2:
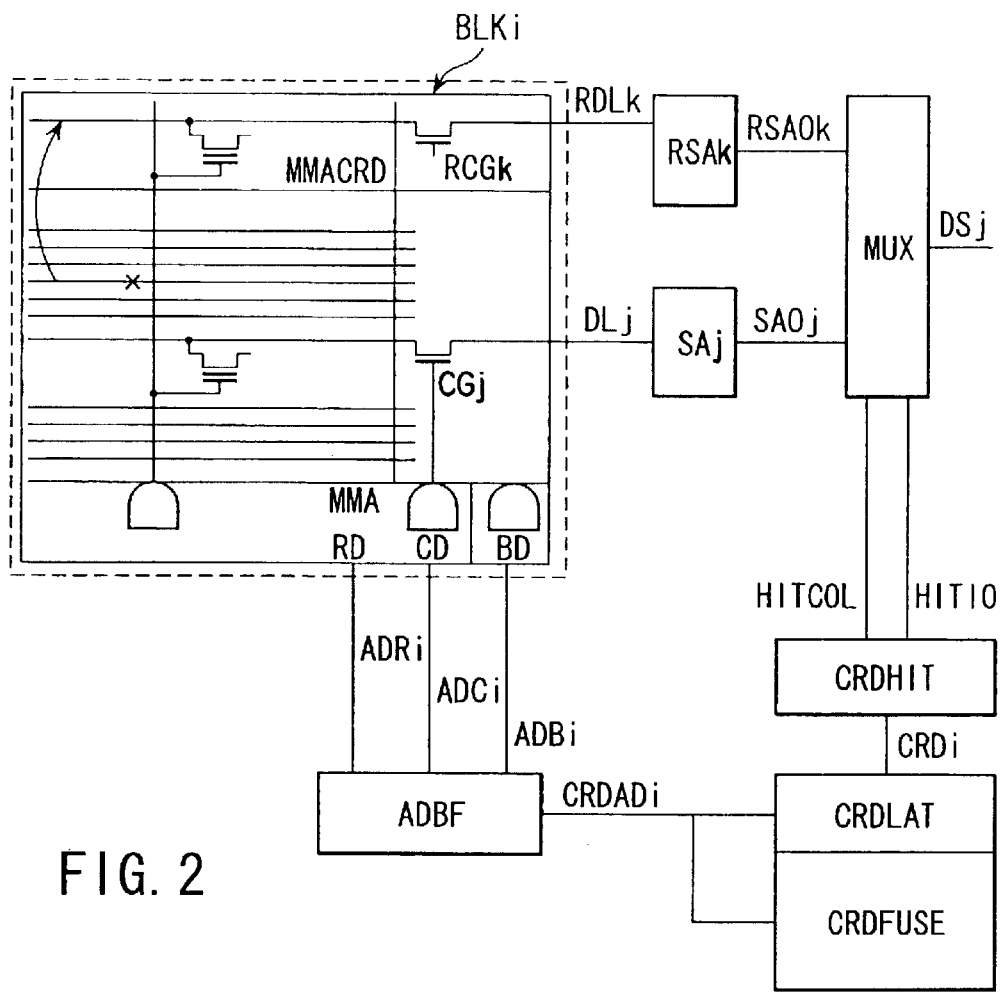
FIG. 2 is a diagram showing a concrete configuration of a column rescue related portion of the embodiment of the present invention.
Figure 7:
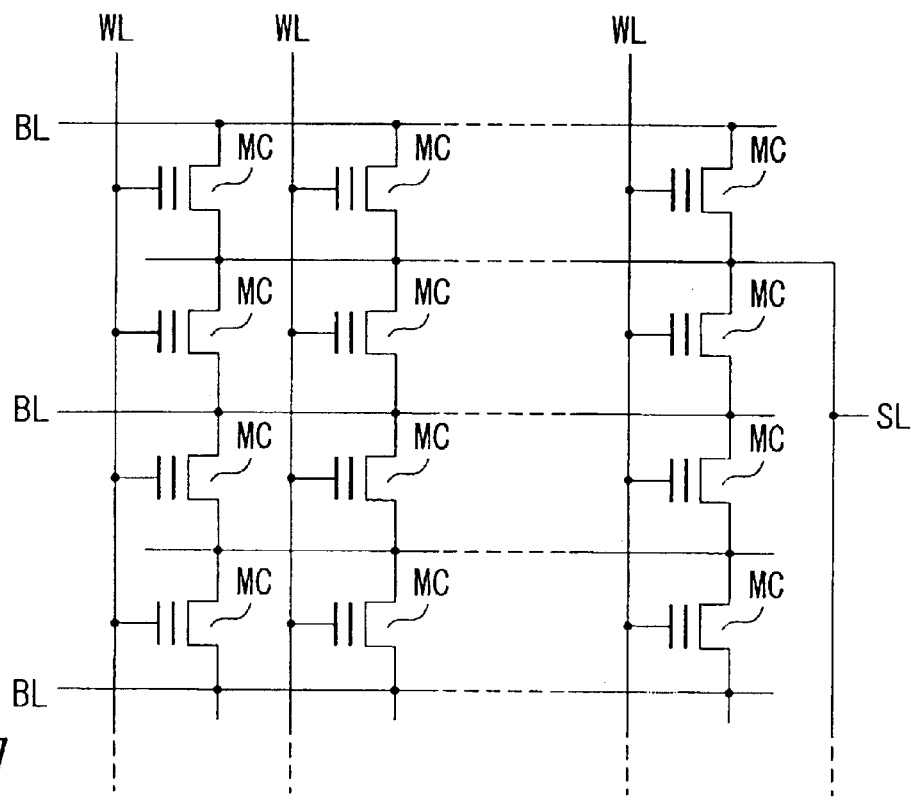
FIG. 7 is a diagram showing a configuration of a cell array of an EEPROM.
Figure 8:
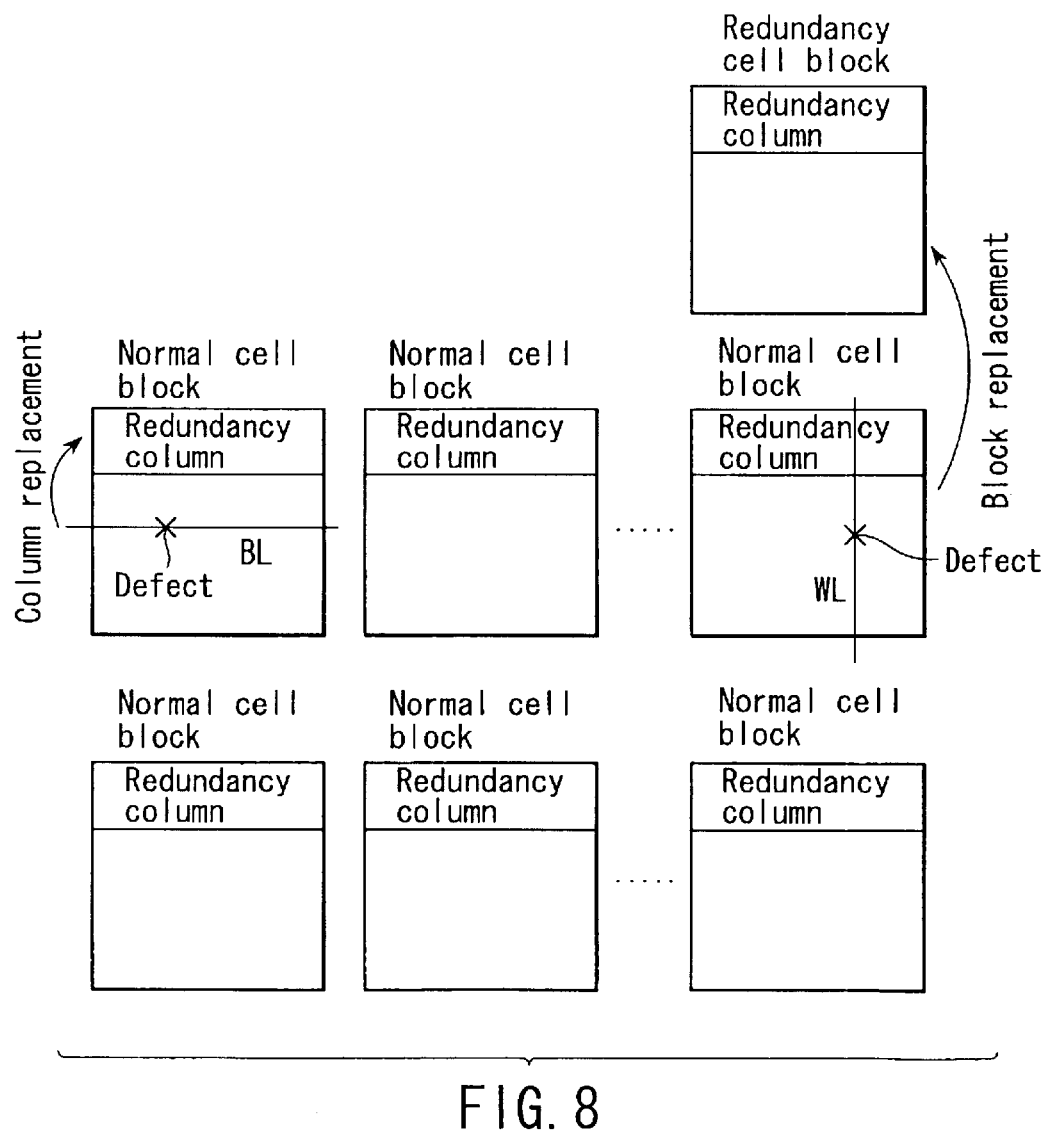
FIG. 8 is a diagram for explanation of the principles of column rescue and block rescue of a conventional EEPROM.

FIG. 2 is shows a concrete configuration of each of the blocks BLKi and the configuration of the peripheral circuits thereof. The main body block (normal cell block) BLKi comprises a main body memory cell array MMA. The main body block BLKi further comprises a rescue memory cell column (spare column cell array, i.e., redundancy column cell array) MMACRD for rescuing a defective column of the memory cell array MMA in units of one or several columns. As shown in FIG. 7, the main body memory cell array MMA is configured by arranging memory cells MC in a matrix form. Bit line selection is carried out by a column selection decoder (column decoder) CD and a column selection gate (column gate) CG, and word selection is carried out by a row selection decoder (row decoder) RD.

The rescue memory column MMACRD is provided in units of several columns (for example, in units of four columns) in accordance with, for example, the size of dust, and several sets (for example, two sets) of the rescue memory columns MMACRD are provided. The rescue memory cell column MMACRD is selected by a rescue column selection gate (spare column gate) RCG and the row decoder RD. Further, block decoders BD for block selection BD are provided for the respective block cores BLKi.

The main body memory cell array MMA is connected to sense amplifier circuit SAj via column gate CGj and data line DLj. The sense amplifier circuit SAj carries out reading operation so that SAOj is outputted. In the EEPROM, j sense amplifier circuits SAj, j column gates CGj and j data lines DLj are provided. Further, the rescue memory cell column MMACRD is connected to rescue sense amplifying circuit RSAk via spare column gate RCGk and data line RDLk. The sense amplifier carries out reading operation so that RSAOk is outputted. In the EEPROM, k rescue sense amplifying circuits RSAk, k spare column gates RCGk and k data lines RDLk are provided.

The rescue block BRDBLKi (FIG. 1) has the same configuration as the main body block BLKi.

Backing to FIG. 1, power source decoders VD provided for the respective banks BANK0, BANKi includes decoder circuits for carrying out switching of the internal voltage at the time of writing and erasing, and selection of the respective memory cells. Switching between For Read and For Auto is configured such that busy signals Busy0 and Busyi, which become "H" while writing and erasing are being executed, are inputted into the power source decoder VD of the banks BANK0 and BANKi, respectively, and when BUSY="L", For Read is selected, and when BUSY="H", For Auto is selected.

Defect address information for column rescue is stored in a defective column address memory circuit CRDFUSE. The address information stored in the defective column address memory circuit CRDFUSE is read out at the time when, for example the power is turned on, and is latched at a defect address latching circuit CRDLAT.

Defective block address information for rescuing block cores is stored in a defective block address memory circuit BRDFUSE (FIG. 1). The address information stored in the defective block address memory circuit BRDFUSE is latched at a defective block address latching circuit BRDLAT when turning on of the power source is detected.

A column address signal ADCi, a row address signal ADRi, and a block address signal ADBi are outputted from an address buffer ADBF, and these column address signal ADCi, row address signal ADRi, and block address signal ADBi are respectively sent to the column decoder CD, the row decoder RD, and the block decoder BD. A column address signal RDADCi (which may be the same as ADCi, but whose outputting timing can be changed), for comparison with a defective column address, is outputted from the address buffer ADBF. A defective column address sensing circuit CRDHIT compares an output CRDi of the defect address latching circuit CRDLAT and the output RDADCi from the address buffer ADBF, and outputs a replacement signal HITCOL="H" when a defect address is detected. Further, the defective column address sensing circuit CRDHIT outputs defect IO information from an HITIO.

The replacement signal HITCOL and the HITIO are received by a multiplexer MUX to replace the output of the sense amplifying circuit SAj with an output RSAk of a predetermined rescue sense amplifying circuit and output RSAk as DSj. DSj is outputted to an external terminal via an output buffer, not shown, and it is possible to relieve defect addresses in units of columns.

A block address signal RDADBi (which may be the same as ADBi, but whose outputting timing can be changed), for comparison with a defective block address, is outputted from the address buffer ADBF. A defective block address sensing circuit BRDHIT compares an output BRDi of the defective block address latching circuit BRDLAT and the output RDADBi from the address buffer ADBF, and outputs a replacement signal HITBLKi="H" and HITBLKB="L" when a defective block address is detected. The HITBLKB is a disable signal of the defective block. The disable signal HITBLKB is inputted to the block decoders of the main body block BLKi, and forcibly makes the main body block be in a non-selected state. Further, the redundancy block is set in a selected state by the replacement signal HITBLKi inputted to the block decoder of the rescue (redundancy) block BRDBLKi.

In the defect address memory circuits CRDFUSE and BRDFUSE, for example, a nonvolatile memory transistor having the same structure as a nonvolatile memory cell of the memory cell array is used as a memory element. However, the memory elements of the defect address memory circuits CRDFUSE and BRDFUSE can be designed independently of the main body memory cell. For example, although the stored information is latched by the defect address latching circuit at the time when the power is turned on, there are cases in which, as the word line voltage at this time, for example, the power source voltage is used. In this case, if the power source voltage is low (for example, 2V), there is the need to make the threshold voltage of a cell which is in an erased state to be low. Because the time required for making the threshold voltage in the erased state be low depends on the threshold voltage of a cell in a neutral state, the threshold voltage of the memory transistor, which is the memory element of the defect address memory circuit, is preferably lower than that of the main body cell.

FIG. 5 shows a comparison of the main body memory cell and the memory transistor of the defect address memory circuit in which these circumstances are taken into account.

Figure 5A:
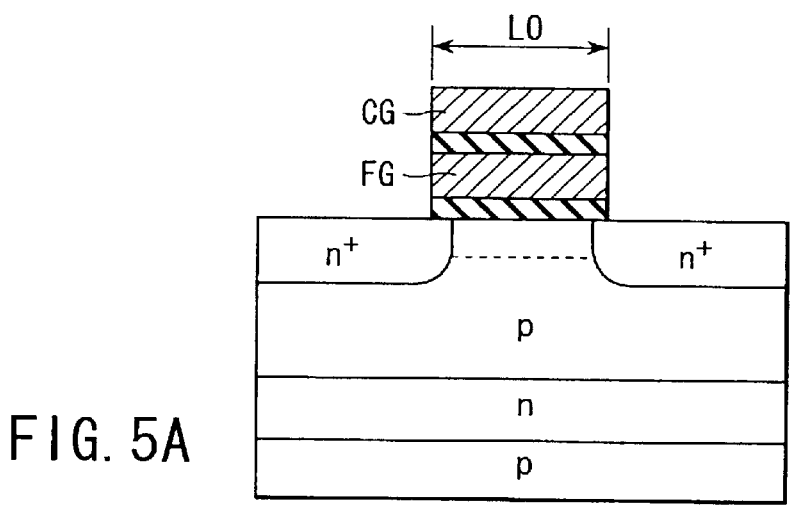
FIG. 5A shows a cross-sectional structure of a memory transistor for use in a memory cell of the embodiment of the present invention.

As shown in FIG. 5A, a channel ion injection for increasing the threshold voltage is carried out for the main body memory cell.

Figures 5B, 5C:
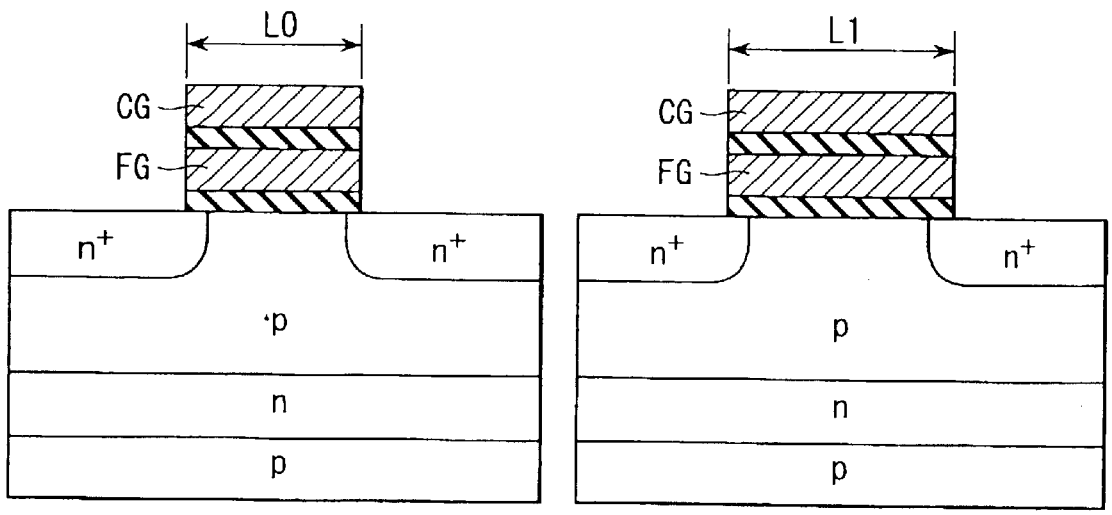
FIGS. 5B and 5C are diagrams respectively showing cross-sectional structures of memory transistors for use in a defect address memory circuit to be used in the memory cell of the embodiment of the present invention.
Figure 6:
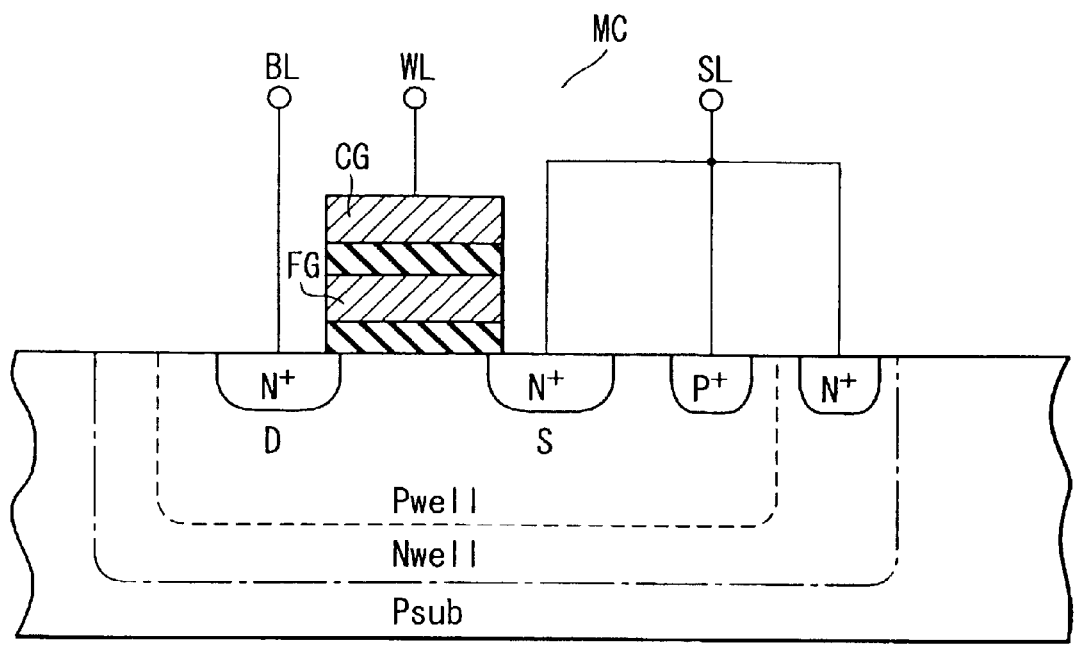
FIG. 6 is a diagram showing a structure of a nonvolatile memory cell of an EEPROM.

On the other hand, for the memory transistor of the defect address memory circuit, as shown in FIG. 5B, a channel ion injection is not carried out so that the threshold voltage is maintained low. However, a slight channel ion injection may be carried out for the memory transistor of the defect address memory circuit, so that the threshold voltage is slightly increased. In these cases of the memory transistor of the defect address memory circuit, there is a possibility that punch-through breakdown (a leak in a transistor) will become a problem for the memory element of the defect address memory circuit. In order to solve this problem, as shown in FIG. 5C, it is effective to provide a gate length L1 which is larger than the gate length (channel length) L0 of the main body cell.

A busy decoder BUSYDEC is a decoding circuit which, from the BRDFUSE information, prepares information expressing to which bank the replaced rescue block belongs, and which generates a signal RDBUSYi synchronized with a desired busy signal BUSY.

In this embodiment, as a countermeasure for a case in which rescue regions of the block rescue and the column rescue overlap with one another, it is configured such that a rescue block sensing circuit CRDBRDHIT is included in the defect address sensing circuit CRDHIT of the column. Simultaneously, an encoding circuit ENC of the defective block is provided for the defect address sensing circuit BRDHIT of the block. In the same way as in the defective block address sensing circuit BRDHIT, the block address signal RDADBi and the output BRDi of the rescue address latching circuit BRDLAT of the block are inputted to the rescue block sensing circuit CRDBRDHIT. Moreover, a hit signal HITBLK of block rescue and an output ENCi of the encoding circuit ENC are inputted to the rescue block sensing circuit CRDBRDHIT. The encoding circuit ENC encodes the output of the defective block address sensing circuit BRDHIT, and outputs an output ENCi indicating which block is a defective block.

In this embodiment, at the time of column rescue, when the hit signal HITBLK of block rescue inputted to the defective column address sensing circuit CRDBRDHIT is "L" (when block rescue is not being carried out), in the defective column address sensing circuit CRDBRDHIT, comparison with the defective column address RDADBi which has been already programmed becomes valid, so that the defective column address sensing circuit CRDBRDHIT outputs a replacement signal of column rescue.

On the other hand, when the hit signal HITBLK of block rescue is "H" (when block rescue is being carried out), in the defective block sensing circuit CRDBRDHIT, comparison with the output ENCi of the encoding circuit ENC becomes valid. Further, control is carried out in which the replacement signal output of column rescue which has been already programmed for the rescue block is made to be invalid, and a replacement signal output for column rescue, which is newly programmed when there is a column defect with respect to a redundancy block replaced in units of blocks is made to be valid.

Figure 3:
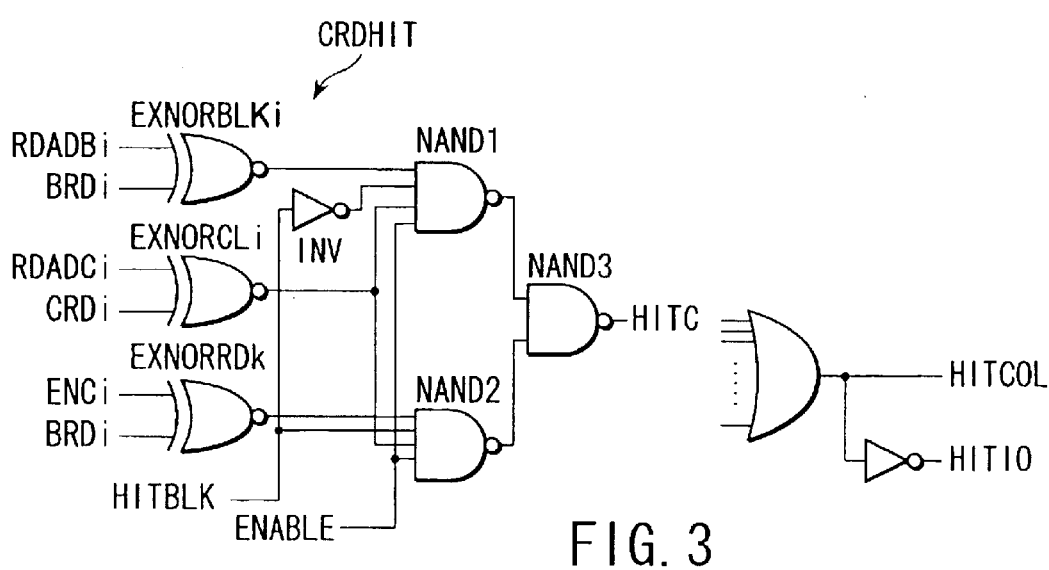
FIG. 3 is a diagram showing a configuration of a defective column address sensing circuit of the embodiment of the present invention.

FIG. 3 is a concrete configuration of the defective column address sensing circuit CRDHIT. EXNORBLKi denotes a plurality of EXNOR gates serving as a block address comparing circuit which compare, for each bit, the block address signal RDADBi and the output signal BRDi of the defective block address latching circuit BRDLAT. EXNORCLi denotes a plurality of EXNOR gates serving as a column address comparing circuit which compare the column address signal RDACi and the output signal CRDi of the defective column address latching circuit CRDLAT.

Further, EXNORRDk denotes EXNOR gates serving as a rescue block sensing circuit which compare the output ENCi of the encoding circuit ENC added to the defective block address sensing circuit and the output BRDi of the defective block address latching circuit BRDLAT.

The output of the gate EXNORBLKi is inputted to a first NAND gate NAND1, and the output of the gate EXNORRDk is inputted to a second NAND gate NAND2. The output of the gate EXNORCLi is inputted to the NAND gates NAND1 and NAND2. Here, the gates EXNORBLKi and EXNORCLi are the main body portion of the defective column address sensing circuit CRDHIT in FIG. 1, and the gate EXNORRDk corresponds to the defective block sensing circuit CRDBRDHIT added to the defective column address sensing circuit.

In an address in which block rescue is not carried out (HITBLK="L"), the first NAND gate NAND1 is set in an active state. Hence, a hit signal HITC signal for carrying out column replacement is outputted depending on the compared results of the gates EXNORBLKi and EXNORCLi. Further, at an address in which block rescue is carried out (HITBLK="H"), the first NAND gate NAND1 becomes inactive. As a result, when a block corresponding to a defective column address which has been already pro-grammed becomes defective thereafter, the output of the hit signal of column replacement is invalid.

Further, when the HITBLK signal is "H", the second NAND gate NAND2 is set in an active state instead of the first NAND gate NAND1, and the hit signal HITC is outputted depending on the sensed results of the gates EXNORCLi and EXNORRDk. In other words, the NAND gate NAND2 outputs the hit signal HITC in accordance with the output of the gate EXNORRDk detecting the rescue block, and the output of the gate EXNORCLi based on the result of programming to the address memory circuit CRD-FUSE of the defective column address in the redundancy block carrying out defective block rescue.

In an actual semiconductor memory device, a plurality of the circuits CRDHIT are included in the memory device, and OR signals of the respective HITC signals are the signals HITCOL for making the sense amplifier RSA of the redundancy column to be active. HITIO which is defect IO information is a signal for replacing the sense amplifier of the defective IO. Note that an enable signal ENABLE to be inputted into the NAND gates NAND1 and NAND2 is programmed in the defect address memory circuit CRD-FUSE separately from the address data, in order to avoid a case in which the defect address memory circuit CRDFUSE mistakenly treats as valid an all "1" state which has not yet been programmed.

Figure 4:
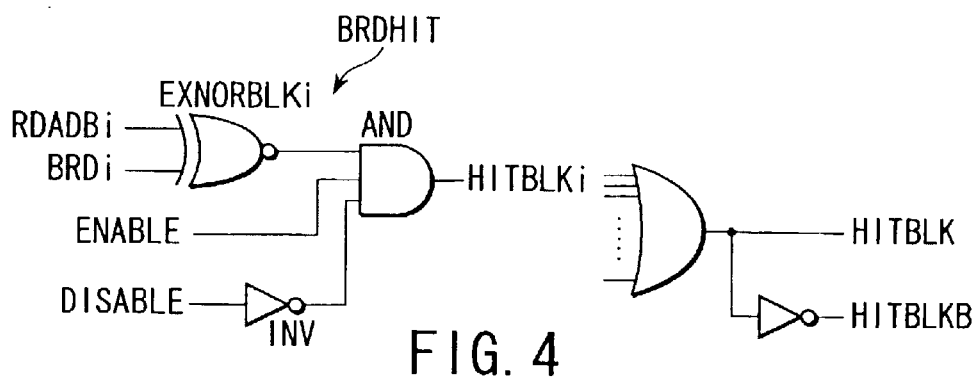
FIG. 4 is a diagram showing a configuration of a defective block address sensing circuit of the embodiment of the present invention.

FIG. 4 shows a concrete configuration of the defective block address sensing circuit BRDHIT. EXNORBLKi denotes a plurality of EXNOR gates serving as an address comparing circuit which compare, for each bit, the block address signal RDADBi and the output signal BRDi of the defective block address latching circuit BRDLAT. When all the outputs of the gate EXNORBLKi become "H", the hit signal HITBLKi is outputted as a rescue block selection signal from an AND gate AND.

The enable signal ENABLE is a signal for making the circuit active. The disable signal DISABLE is a signal which, when a defect is newly found in the redundancy block or the like after the circuit is made to be active, makes the defect be "H" when it is desired to make the active state of the circuit invalid. These enable signal ENABLE and disable signal DISABLE along with the defect address are programmed in the address memory circuit BRDFUSE.

In an actual memory, a plurality of the circuits are included in the memory, and the OR signals of the respective hit signals HITBLKi thereof are outputted as the replacement signals HITBLK, and the inverted signals are the main body block disable signals HITBLKB.

As described above, according to an actual mode, when there is a defective column in the rescue block (redundancy block) after the block after column rescue is block-relieved, the previous column rescue is made to be invalid, and defective column rescue in the redundancy block can be carried out. Therefore, the efficiency of defect rescue of the EEPROM can be improved.

Note that, in the present embodiment, preferably, a test circuit which forcibly makes the replacement signal HIT-BLKi of block rescue be "H" is loaded so that the redundancy block BRDBLKi can be forcibly selected. More specifically, as shown in FIG. 1, a test mode for carrying out a test of the redundancy block BRDBLKi is provided which inputs a test signal TEST from the exterior to the defective block address sensing circuit BRDHIT, and which forcibly makes the replacement signal HITBLKi be "H". Accordingly, if a column defect in the redundancy block BRDBLKi is found in advance and column rescue is carried out by programming the column defect, the degrees of freedom of a good item selection test are even higher.

Further, in the embodiment, explanation is given of a combination of column rescue and block rescue which carry out rescue for each unit column cell array in the block. However, the present invention is effective for a semiconductor memory device using a defect rescue method having two or more types of rescue circuits whose rescue regions overlap and in which the sizes of the rescue ranges are different, such as a combination of row rescue and block rescue which carry out rescue for each unit row cell array (one or several rows) within a block.

The present invention also can be applied to not only an EEPROM, but also to other semiconductor memories such as a DRAM or the like in a similar manner.

In addition, as the defect address memory circuit, other than using a memory element similar to a nonvolatile memory cell, an electrical fuse also can be used.

As described above, according to the present invention, there is provided a semiconductor memory device in which, when two types of rescue circuits whose rescue regions are different are provided, high defect rescue efficiency can be realized without deteriorating rescue efficiency due to interference between the rescue circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a plurality of memory cell blocks each comprising a plurality of memory cells;

a first redundancy cell array provided for each of the memory cell blocks, the first redundancy cell array configured to rescue a defective cell array in said each memory cell block;

a redundancy cell block provided for said plurality of memory cell blocks, said redundancy block being configured to rescue a defective block of the memory cell blocks;

a second redundancy cell array provided for the redundancy cell block, the second redundancy cell array configured to rescue a defective cell array in the redundancy cell block;

a first defect rescuing circuit having a first address memory circuit and a first address sensing circuit, the first address memory circuit configured to store an address of the defective cell array in the memory cell blocks, the first address sensing circuit configured to compare a signal of the stored address and an address signal from external and output a replacement signal for replacing the defective cell array in the redundancy block with the first redundancy cell array; and a second defect rescuing circuit having a second address memory circuit and a second address sensing circuit, the second address memory circuit configured to store an address of the defective block of said plurality of memory cell blocks, the second address sensing circuit configured to compare a signal of the stored address of the defective block with an address signal from external to output a replacement signal for replacing the defective block of said plurality of memory cell blocks with said redundancy cell block, wherein the first defect rescuing circuit has a gate circuit which outputs the replacement signal outputted by the first address sensing circuit as valid at an address at which the second defect rescuing circuit is not implemented, and which outputs a signal indicating which block is a defective block outputted by the second defect rescuing circuit as valid at an address at which the second defect rescuing circuit is implemented.

2. A semiconductor memory device according to claim 1, wherein the first defect rescuing circuit controls the gate circuit such that, by the replacement signal outputted by the second defect rescuing circuit, the replacement signal outputted by the first address sensing circuit is made to be invalid not to output the replacement signal.

3. A semiconductor memory device according to claim 1, wherein the first defect rescuing circuit has a defective block detecting circuit which controls the gate circuit such that the defective block is detected on the basis of the replacement signal outputted by the second defect rescuing circuit, and the signal indicating which block is a defective block outputted by the second defect rescuing circuit is made to be valid based on the detected result and is outputted.

4. A semiconductor memory device according to claim 1, wherein the memory cells are an electrically erasable and rewritable nonvolatile memory cells.

5. A semiconductor memory device according to claim 4, wherein memory elements of the first and second address memory circuits are electrically erasable and rewritable nonvolatile memory transistors which have the same structure as the nonvolatile memory cells.

6. A semiconductor memory device according to claim 5, wherein the nonvolatile memory transistors are set to a threshold voltage lower than that of the nonvolatile memory cells.

7. A semiconductor memory device according to claim 5, wherein the nonvolatile memory transistors have a channel length longer than that of the nonvolatile memory cells.

8. A semiconductor memory device according to claim 1, wherein said plurality of blocks are grouped into a plurality of banks, and, while erasing or writing of data is being executed at a given bank, reading of data is possible at another bank.

9. A semiconductor memory device according to claim 1, wherein in a test mode the redundancy block is tested by inputting a test signal to forcibly output the replacement signal from the second defect rescuing circuit.

* * * * *